United States Patent [19]

Nakamura et al.

[11] Patent Number: 5,114,467
[45] Date of Patent: May 19, 1992

[54] METHOD FOR MANUFACTURING MAGNETOSTRICTIVE MATERIALS

[75] Inventors: Eiji Nakamura; Hiroyuki Mizutani, both of Aichi, Japan

[73] Assignee: Sumitomo Light Metal Industries Ltd., Tokyo, Japan

[21] Appl. No.: 673,555

[22] Filed: Mar. 22, 1991

[51] Int. Cl.⁵ .......................... C22D 7/00; C22B 4/00
[52] U.S. Cl. .................................................. 75/10.22
[58] Field of Search ........................................ 75/10.22

[56] References Cited

U.S. PATENT DOCUMENTS 3,862,834 1/1975 Von Waclawiczek ............ 75/10.22
4,519,835 5/1985 Gauvin ............................. 75/10.22

Primary Examiner—Peter D. Rosenberg
Attorney, Agent, or Firm—Sughrue, Mion, Zinn Macpeak & Seas

[57] ABSTRACT

A method for manufacturing rare earth-iron magnetostrictive materials such as $Tb_xDy_{1-x}Fe_{2-w}$ wherein $0.20 \leq x \leq 1.00$ and $0 \leq w \leq 0.20$. Rare earth and iron raw materials are continuously fed into a plasma arc melting furnace having a plasma arc torch and a water-cooled bottomless elongated mold located beneath the torch. The raw materials are melted together by plasma flames to form a pool of a molten alloy at the top of the mold. Heat is removed from the melt by water cooling through the mold, thereby causing the melt to solidify progressively from the bottom thereof. The solidified body is continuously pulled down in the mold.

9 Claims, 4 Drawing Sheets

WITHDRAWAL DIRECTION →

1mm

METHOD FOR MANUFACTURING MAGNETOSTRICTIVE MATERIALS

BACKGROUND OF THE INVENTION

This invention relates to a method for manufacturing magnetostrictive materials. More particularly, the invention is concerned with a method of inexpensively manufacturing rod-shaped rare earth-iron magnetostrictive materials having good purity and quality.

Since the 1970's rare earth-iron magnetostrictive materials having a Laves structure of $RE-Fe_2$ have attracted considerable interest since they can create large room temperature magnetostriction due to their high Curie points. They promise to be suitable for a wide variety of technological applications including generation of ultrasonic waves in sonar, as drive elements in small transducers and actuators, as vibration dampers, and as switches or valves. Many attempts have been proposed to manufacture such materials.

U.S. Pat. No. 4,308,474 discloses a grain-oriented polycrystalline or single crystal rare earth-iron magnetostrictive material of the formula $Tb_xDy_{1-x}Fe_{2-w}$ wherein $0.20 \leq x \leq 1.00$ and $0 \leq w \leq 0.20$. The rare earth metals may be partly replaced by Sm and/or Ho.

U.S. Pat. No. 4,378,258 discloses another rare earth-iron magnetostrictive material of the formula $R_xT_{1-x}$ wherein R is a rare earth or mixtures thereof, T is Fe, Ni, Co, Mn, or mixtures thereof, and $0 < x < 1$.

Other publications disclosing rare earth-iron magnetostrictive materials include Japanese Patent Publication No. 61-33892(1986) and Japanese Patent Application Kokai No. 64-73050(1989).

U.S. Pat. No. 4,152,178 discloses a sintered rare earth-iron magnetostrictive product with a grain oriented morphology manufactured by the powder metallurgy method. The grain orientation is created by magnetically aligning powder particles of the magnetostrictive material prior to sintering. The product is essentially polycrystalline.

U.S. Pat. No. 4,609,402 describes the manufacture of a single-crystal rod of a rare earth-iron magnetostrictive material by a free-standing zone melting (FSZM) method. This method provides a product with excellent magnetostrictive properties. However, the productivity of the method is rather low.

U.S. Pat. No. 4,770,704 describes a modified Bridgman method in which a grain-oriented polycrystalline magnetostrictive material rod can be manufactured more efficiently. According to this method, a previously-prepared alloy which is usually in the form of buttons or fingers is melted by induction heating in a crucible having a bottom outlet. The melt is discharged through the outlet and deposited in an elongated mold which is either fixed or movable downwardly. Heat is removed from the deposited melt through the lower end portion of the mold to progressively solidify the melt from the bottom. The solid-liquid interface of the melt moves upwardly toward the top of the mold. The unidirectional solidification of the melt produces axial grain orientation in the product.

Other methods which can be applied to the manufacture of a magnetostrictive material having a Laves structure include powder bonding and casting.

Since an optimum magnetostriction of a magnetostrictive material of the Laves structure is obtained along the $<111>$ direction, it is desirable that the grains be aligned or oriented in the $<111>$ direction.

In the above-mentioned FSZM method and modified Bridgman method, however, it is difficult to prepare magnetostrictive materials having $<111>$ alignment along the longitudinal axis of the rod. Instead, these methods tend to grow crystals with $<112>$ alignment. Therefore, $<112>$ aligned materials have been used for practical purposes.

According to the powder metallurgy method, it is possible to obtain $<111>$ aligned magnetostrictive materials by magnetic aligning. However, it is difficult to align all the powder particles in this manner. As a result, the magnetostrictive properties of a product prepared by powder metallurgy are inferior to those of a $<112>$ aligned polycrystalline or single crystal rod prepared by the FSZM or modified Bridgman method.

In the FSZM, modified Bridgman, and powder metallurgy methods, a previously-prepared alloy having the same composition as the product has to be used as a starting material in order to assure that the product has a uniform microstructure. A powdered alloy is used in the powder metallurgy method, while an alloy in the form of buttons or fingers is usually used in the other methods.

Thus, prior to the manufacture of the magnetostrictive materials, the metallic raw materials must be melted together in a crucible to form an alloy having a uniform composition. For this purpose, either high-frequency induction melting or arc melting can be employed.

Induction melting greatly activates the rare earth metals in the raw materials. Therefore, when a crucible for commercial use is used, the rare earth metals tend to react with the material which constitutes the crucible and it is practically impossible to avoid contamination of the product with the crucible material, resulting in degradation in the magnetostrictive properties of the product. For this reason, alloying is frequently performed by arc melting of the raw materials in a water-cooled copper hearth to form an alloy in the shape of a small button or finger. This method, however, is not suitable for commercial-scale production of the alloy.

Regardless of the alloying method, the formation of an alloy from metallic raw materials in a separate step, i.e., the use of a preliminary alloying step adds to the manufacturing costs of the magnetostrictive materials.

Casting is an inexpensive method which can be applied to the manufacture of a magnetostrictive material. For this purpose, metallic raw materials are melted by arc heating or induction heating and then solidified in a mold. However, this method tends to produce a polycrystalline product with randomly oriented grains unless a special technique is employed to cause unidirectional solidification. As a result, the properties of the product are much inferior to a $<112>$ aligned polycrystalline or single crystal rod obtained by the FSZM or modified Bridgman method. For example, the magnetostriction of the product is as low as one-third to one-tenth that of the aligned rod.

A unidirectional solidification technique has been applied to the manufacture of industrial materials such as turbine blades of a superalloy, e.g., a Ni-based superalloy. The powder down method and the high-rate solidification method have been developed to perform unidirectional solidification. However, these methods usually involve melting of the material by induction heating. Therefore, it is difficult to adopt these methods in the manufacture of a magnetostrictive material, since contamination of the product with the crucible material may occur as described above.

SUMMARY OF THE INVENTION

It is an object of this invention to provide a method for inexpensively and efficiently manufacturing high-quality rare earth-iron magnetostrictive materials with axial grain orientation.

Another object of this invention is to provide a method for manufacturing such materials which is capable of continuous alloying, casting and crystallization without the need for a separate alloying step to prepare a starting material.

The present invention provides a method for manufacturing rare earth-iron magnetostrictive materials comprising continuously feeding rare earth and iron raw materials into a plasma arc melting furnace having a plasma arc torch and a water-cooled bottomless elongated mold located beneath the torch, melting the raw materials together by plasma flames to form a molten alloy at the top of the mold, removing heat from the melt by water cooling through the mold so as to cause the melt to solidify progressively from the bottom thereof, and continuously pulling down the solidified body in the mold.

Further objects of the present invention as well as the nature and advantages thereof will be apparent from the following detailed description of the invention.

DETAILED DESCRIPTION OF THE INVENTION

Figure 1:
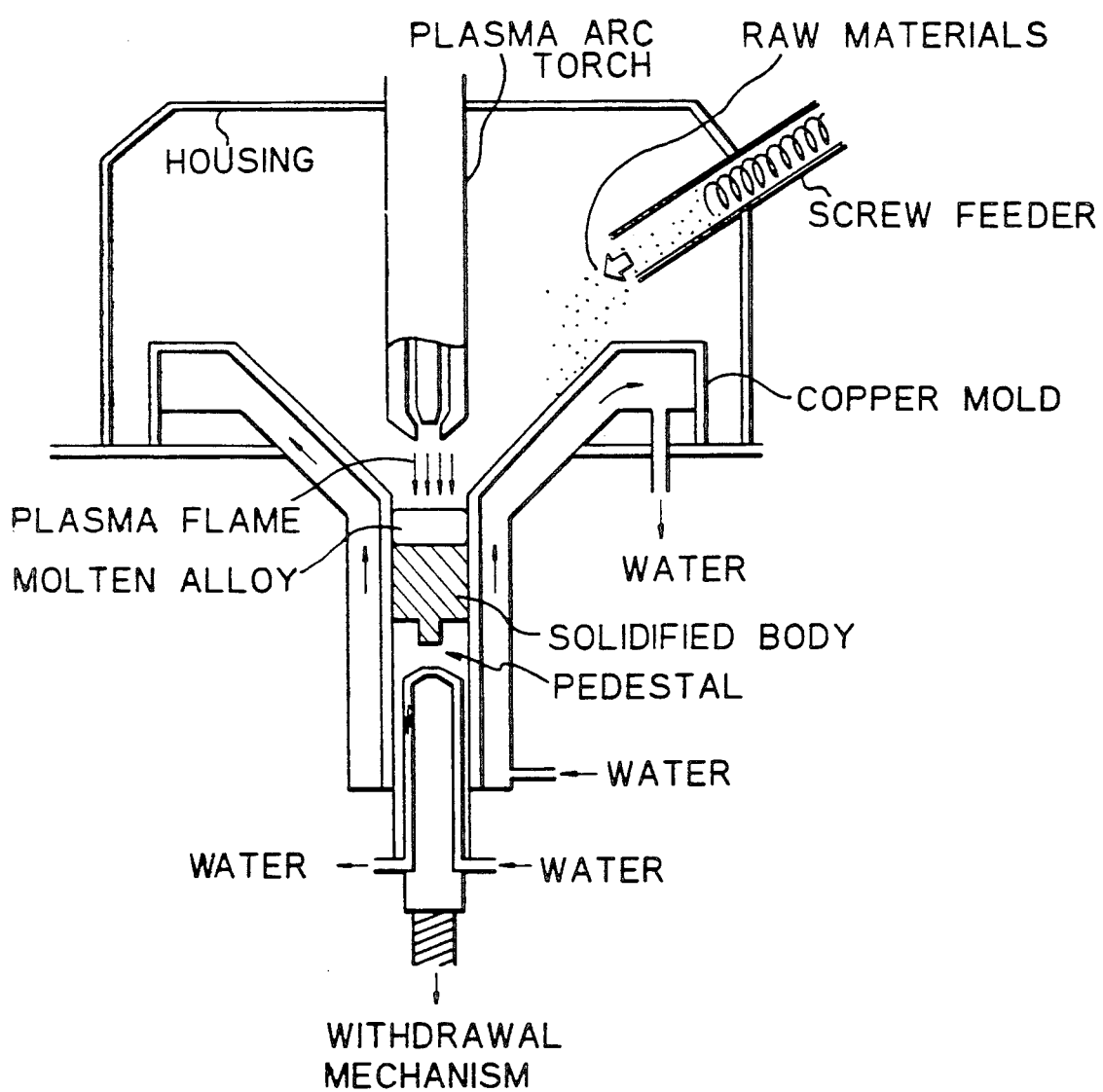
FIG. 1 is a schematic illustration of a plasma arc melting furnace useful for the practice of the manufacturing method of the present invention.

The method of the present invention can be applied to any of various rare earth-iron magnetostrictive materials known in the art. The rare earth is preferably a combination of Tb with at least one other rare earth element such as Dy, Ho, Sm, Er, and Tm, and more preferably a combination of Tb with Dy and/or Ho. The term iron used herein means an iron group metal which includes Fe, Co, and Ni. Preferably, the iron is Fe. Other transition metals such as Mn may be substituted for a small part of the iron. Preferred magnetostrictive materials are those disclosed in U.S. Pat. No. 4,308,474. More preferred materials are alloys known as Terfenol-D which have the formula $Tb_{0.27-0.3}Dy_{0.73-0.7}Fe_{1.8-2}$, especially $Tb_{0.3}Dy_{0.7}Fe_{1.9-1.95}$.

A plasma arc melting furnace has been developed for melting of titanium or high-grade steel alloys. However, it has not been employed for use in the manufacture of rare earth-iron magnetostrictive materials.

Surprisingly it has been found that, by casting in a plasma arc melting furnace having an elongated mold and progressively pulling down the solidified cast body, a grain-oriented rare earth-iron magnetostrictive material of high quality can be continuously manufactured with a high production rate directly from metallic raw materials, thereby eliminating a preliminary alloying step. The reasons for this result are not yet understood completely but are considered to be as follows.

The heating mode for melting in the furnace is arc heating rather than induction heating. Therefore, individual raw materials can be fed to the furnace without preliminary alloying and alloyed in the melting furnace, and contamination of the cast product with elements coming from the mold is minimized in spite of simultaneous alloying and casting. In contrast, according to the FSZM or modified Bridgman method, the raw materials should be preliminarily alloyed in a separate step prior to casting since induction heating is employed for melting.

The temperature of the resulting molten alloy prepared by arc melting reaches at least 3,000 K, which is higher than the melt temperature attained by induction melting. Therefore, the axial temperature gradient in the melt can be enhanced compared to induction melting. In general, it is empirically known that columnar grains inherent in unidirectional solidification are formed when the ratio of G/R (where G is the temperature gradient in the melt and R is the rate of solidification) is greater than a certain value. It is believed that the arc melting employed in the present invention can readily satisfy this empirical rule for unidirectional solidification. Furthermore, it has been found that the preferential crystallographic orientation of the growing grains is stable in the <112> direction even in the case of arc melting. As a result, a highly grain-oriented product exhibiting a large magnetostriction can be obtained according to the present invention.

Arc melting can be performed by various methods including consumable electrode arc melting, nonconsumable electrode arc melting, and plasma arc melting. Consumable arc melting requires the preliminarily preparation of a rod-shaped electrode of the rare earth-iron alloy prior to melting, which is disadvantageous from the viewpoint of economy. Nonconsumable electrode arc melting is also disadvantageous in that the resulting melt may be contaminated with the element constituting the electrode which is usually tungsten.

It is also conceivable to employ electron beam melting. However, electron beam melting must be performed in a high vacuum atmosphere on the order of $10^{-3}$ to $10^{-8}$ Torr. Therefore, it is difficult to control the alloy composition during melting when it contains a constituent having a relatively high vapor pressure. In addition, electron beam melting requires an expensive apparatus.

Accordingly, plasma arc melting is employed in the present invention.

During melting of a rare earth-iron magnetostrictive material, some oxide contaminants and other inclusions originating from the raw materials or the melting apparatus are inevitably incorporated into the melt and they adversely affect the stability of the desired <112> crystallographic orientation and mechanical properties of the resulting solidified product. According to the present invention, such oxide contaminants and inclusions which are floating on the surface of the melt due to their lower densities are forced to move outwardly toward the mold wall by the action of the gas and plasma flames blown to the melt and are concentrated in the outer peripheral portion of the casting. Therefore, the bulk of the resulting alloy is not appreciably contaminated with oxide contaminants and other inclusions, and a product having a minimized impurity content can be obtained by removal of the outer peripheral portion of the solidified cast rod by a suitable means such as abrasion or machining to a depth sufficient to remove the contaminants concentrated in that portion.

A preferred embodiment of the present invention will now be described with reference to FIG. 1 which schematically shows a plasma arc melting furnace useful in the practice of the present invention. It should be understood, however, that the following embodiment is not restrictive and merely presented for illustration. Various modifications may be employed without departing from the concept of the present invention.

The plasma arc melting furnace shown in FIG. 1 comprises a plasma arc torch, a funnel-shaped bottomless water-cooled copper mold generally located below the torch, a screw feeder through which raw materials are continuously fed into the mold and a downwardly movable or retractable water-cooled pedestal inserted into the mold through the bottom opening thereof so as to serve as a bottom plug of the mold. The pedestal may also be made of copper and water-cooled.

The cylindrical portion of the funnel-shaped mold serves as an elongated mold in which the raw materials are melted and then solidified, while the V-shaped portion thereof serves as a bank to guide the raw materials fed through the screw feeder into the cylindrical mold portion and prevent an overflow of the melt. The V-shaped bank portion and the cylindrical mold portion may be separate members. Similarly the elongated mold need not be circular in cross section. For example, it may have a square, triangular or hexagonal cross section. The funnel-shaped mold is covered by a water jacket for water cooling and cooling water is introduced into the jacket at the bottom thereof so as to create an upward flow of cooling water within the jacket. Such water flow is preferable since it assists in unidirectional solidification of the melt from its bottom.

An inert gas such as argon, helium, or a mixture of argon and helium is used in the plasma arc torch for plasma generation. A housing is provided so as to create an argon atmosphere above the mold and prevent the melt from contacting air. The pressure in the argon atmosphere is usually atmospheric, although a superatmospheric or subatmospheric pressure may be employed.

A rod-shaped grain-oriented rare earth-iron magnetostrictive material having a composition of $Tb_{0.3}Dy_{0.7}Fe_{1.9}$ and dimensions of about 30 mm in diameter and abut 120 mm in length, for example, can be manufactured using the apparatus shown in FIG. 1 in the manner described below.

As mentioned above, the raw materials need not be previously alloyed so as to form an alloy having the same composition as the product. Thus, the raw materials may be the individual alloying metals or master alloys of two or more metallic constituents. All the raw materials should be of purified grade.

In this embodiment, a Tb-Fe master alloy (86 wt % Tb and 14 wt % Fe), a Dy-Fe master alloy (87% Dy and 13% Fe), and Fe metal, all of 3N grade, are used. These raw materials are separately ground in an inert atmosphere to a particle size between 20 mesh and 100 mesh and the appropriate amounts of the ground raw materials are weighed and thoroughly mixed so as to give a mixture for melting having the desired composition of $Tb_{0.3}Dy_{0.7}Fe_{1.9}$.

Before the melting operation is started, a starter alloy having the same composition ($Tb_{0.3}Dy_{0.7}Fe_{1.9}$) as the mixture for melting is fixed on the pedestal using a suitable securing means such as a bolt. The pedestal is then inserted into the cylindrical mold portion through the bottom opening of the mold until the upper surface of the starter alloy secured thereto is slightly below the top end of the cylinder. The pedestal can be downwardly moved by a withdrawal mechanism which comprises a DC motor and a ball-screw driving means (not shown). The withdrawal speed of the pedestal can be varied continuously in the range of from about 10 cm/hr to 300 cm/hr.

The mixed raw materials are continuously fed through the screw feeder into the water-cooled funnel-shaped copper mold such that they are introduced into the cylindrical mold portion beneath the plasma arc torch and melted therein by plasma flames to form a pool of molten alloy on the starter alloy at the top of the cylindrical mold portion.

The position of the plasma arc torch can be varied both in the vertical and horizontal directions by a positioning mechanism (not shown). It is located right above the cylindrical mold portion. The distance between the tip of the torch and the top end of the cylindrical mold portion is adjusted to about 50 mm, for example. The electric power supplied to the arc torch can be varied so as to provide an optimal amount of melting energy.

The screw feeder is capable of feeding the mixed raw materials while maintaining the argon atmosphere within the housing. The feed rate can be controlled by varying the number of revolutions of the screw depending on the desired melting rate.

The molten alloy in the cylindrical mold portion is cooled and progressively solidified from the bottom thereof since the mold is water-cooled as mentioned above and heat is removed from the melt by water cooling through the mold. The pedestal is also water-cooled in order to assist in progressive solidification from the bottom of the melt. For this purpose, a water pipe extends into the pedestal. The pedestal is gradually retracted or downwardly moved depending on the rate of solidification of the melt. Preferably, the feed rate of the raw materials and the withdrawal speed of the pedestal are controlled such that the level of the molten alloy pool is maintained at a substantially constant height in the cylindrical mold.

As described previously, a unidirectional solidification can be realized when the G/R ratio is greater than a certain value which is determined depending on the alloy composition. Therefore, the cooling rate of the melt which can be varied by the flow rate and temperature of the cooling water should be high enough to create a G/R ratio which ensures the desired unidirectional solidification of the melt with alignment of grains along the <112> direction Preferably the cooling rate is also adjusted in such a manner that the molten alloy pool formed at the top of the mold portion has a constant depth.

For example, when the pedestal is continuously withdrawn at a speed of from 10 to 200 cm/hr and the cooling rate is controlled such that the molten alloy pool has a constant depth of about 1 cm, the rate of solidification R is 10-200 cm/hr. The temperature of the melt as formed, i.e., the temperature at the surface of the melt is at least about 3000° K (2727° C.), while the solidification temperature of the alloy (liquidus temperature) of the alloy is about 1250 ° C. Thus, the temperature gradient G in the melt is at least about 1477° C./cm and the value for G/R ratio is at least in the range of 7.4°–147.7° C. hr/cm$^2$. Under these conditions, unidirectional solidification of the molten alloy occurs and grain-oriented polycrystalline or single crystal magnetostrictive product with <112> alignment can be obtained in a stable manner.

After the cast body is completely solidified and cooled, it is completely withdrawn and removed from the mold and an outer peripheral portion of the cast body is preferably removed by abrasion or machining since contaminants are concentrated in that portion and there is a tendency toward random grain orientation therein.

The rare earth-iron magnetostrictive material obtained in this manner according to the method of the present invention has a purity in the bulk portion which is sufficient to exhibit a magnetostriction high enough for practical uses. Moreover, the formation of voids or cracks in the product is minimized or completely eliminated in spite of the simultaneous alloying and casting at a relatively high production rate and a product of a sufficiently large size for practical uses can be readily manufactured. In contrast, when raw materials are directly cast after melting by induction melting or a conventional arc melting technique in which a button-shaped body is cast, the bulk of the product is not purified adequately and has many voids or cracks. Therefore, it is difficult to manufacture a large-sized product and the magnetostrictive properties of the product are much lower than for the product of the present invention.

If desired, the magnetostrictive material produced by the present invention may be used as a starter rod in a zone melting method such as the FSZM method for further purification.

According to the method of the present invention, melting of the raw materials can be completed in a short length of time due to the use of plasma flames and the withdrawal speed of the solidified rod product, namely, the withdrawal speed of the pedestal, which is on the order of from about ten to several hundreds of centimeters per hour, is higher than that attained in the FSZM or unmodified Bridgman method, in which the withdrawal speed is on the order of from several centimeters to several tens of centimeters per hour. Moreover, unlike the modified Bridgman or FSZM method, the raw materials can be directly fed to the melting furnace without the need for preliminary alloying. As a result, the present method can manufacture a grain-oriented rare earth-iron magnetostrictive material efficiently with a high production rate and with decreased production costs.

The pressure in the plasma arc melting furnace may be atmospheric. Therefore, even if a raw material having a high vapor pressure is used for melting, the composition of the product does not vary appreciably and a stable product quality can be assured.

The feeding rate of the raw materials, the cooling rate of the melt, and the withdrawal speed of the solidified body can be maintained at constant values, and the withdrawal speed of the product can be varied over a wide range. Therefore, when other operating conditions fluctuate greatly, the G/R ratio of the melt can easily be kept at a nearly constant value by controlling the product withdrawal speed so as to create the desired unidirectional solidification, and hence a constant product quality is obtained in a stable manner. Furthermore, the present invention may be applied to the manufacture of a wide variety of rare earth-iron magnetostrictive materials by varying the operating conditions.

EXAMPLES

Example 1

A sample rod of a rare earth-iron magnetostrictive material having a composition of $Tb_{0.3}Dy_{0.7}Fe_{1.9}$ and dimensions of 29.5 mm in diameter and 120 mm in length was cast in the above-described manner using a plasma arc melting furnace like that shown in FIG. 1 in which argon gas was used for plasma generation. The raw materials were a Tb-Fe master alloy (86 wt % Tb and 14 wt % Fe), a Dy-Fe master alloy (87% Dy and 13% Fe), and Fe metal, all of 3N grade. These raw materials were ground and intimately mixed in such proportions that the resulting mixture had the composition $Tb_{0.3}Dy_{0.7}Fe_{1.9}$.

The raw material mixture was continuously fed into the plasma arc melting furnace which was operated under the following conditions:

| | |
|---|---|
| Current for plasma arc generation: | 300 A |
| Voltage: | 40 V |
| Withdrawal speed of pedestal: | 60 cm/hr |
| Pressure of argon atmosphere: | 1 atm |
| Feed rate of raw material mixture: | 63 g/min. |

The depth of the molten alloy pool formed during melting was about 1 cm and the temperature at the surface of the melt was about 3000 K. Thus, the G/R ratio during the operation was estimated to be about 25° C. hr/cm$^2$.

The outer periphery of the resulting as-cast cylindrical sample rod had a surface smoothness (or roughness) comparable to that of a semicontinuously cast aluminum ingot and the appearance of the cast rod was sound and free from cracks.

After the sample rod was subjected to heat treatment for 7 days at 1000° C. in an argon atmosphere, the macrostructure in an axial cross section of a test piece of the rod was observed.

Figure 2:
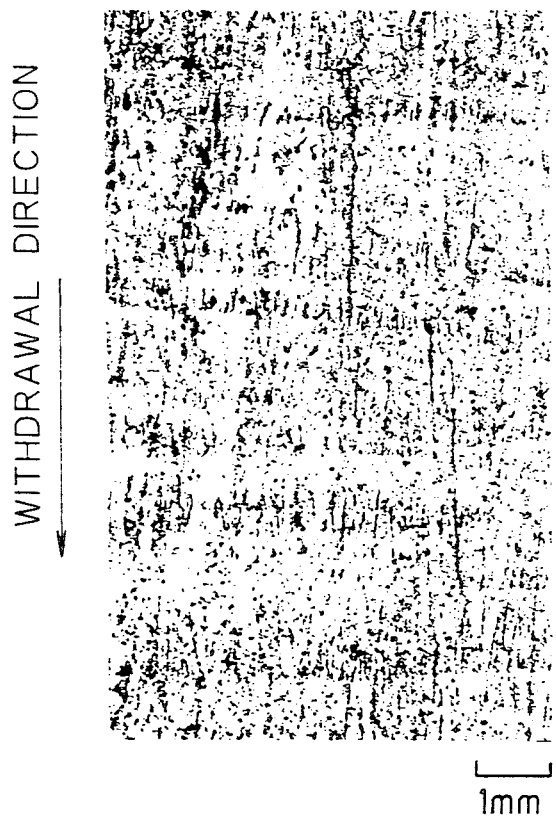
FIG. 2 is a photomicrograph showing a cross-sectional macrostructure of a rare earth-iron magnetostrictive material manufactured by the method of the present invention.

In the observation of the macrostructure, some grains were grown in the radial direction, i.e., perpendicular to the longitudinal axis of the rod, in the outer peripheral portion having a thickness of about 2 mm as measured from the peripheral surface of the rod. However, in the bulk of the rod, i.e., in the remaining internal portion substantially all the grains were grown along the longitudinal axis of the rod as shown in the micrograph of FIG. 2. Thus, the bulk of the rod had axial grain orientation due to unidirectional solidification.

After the approximately 2 mm-thick outer peripheral portion the heat-treated sample rod was removed by abrasion, the value for magnetostriction (λ) of the rod was determined by the ordinary strain gauge method. It has a magnetostriction of $650 \times 10^{-6}$ ppm at 1 kOe in the axial direction.

Figure 3:
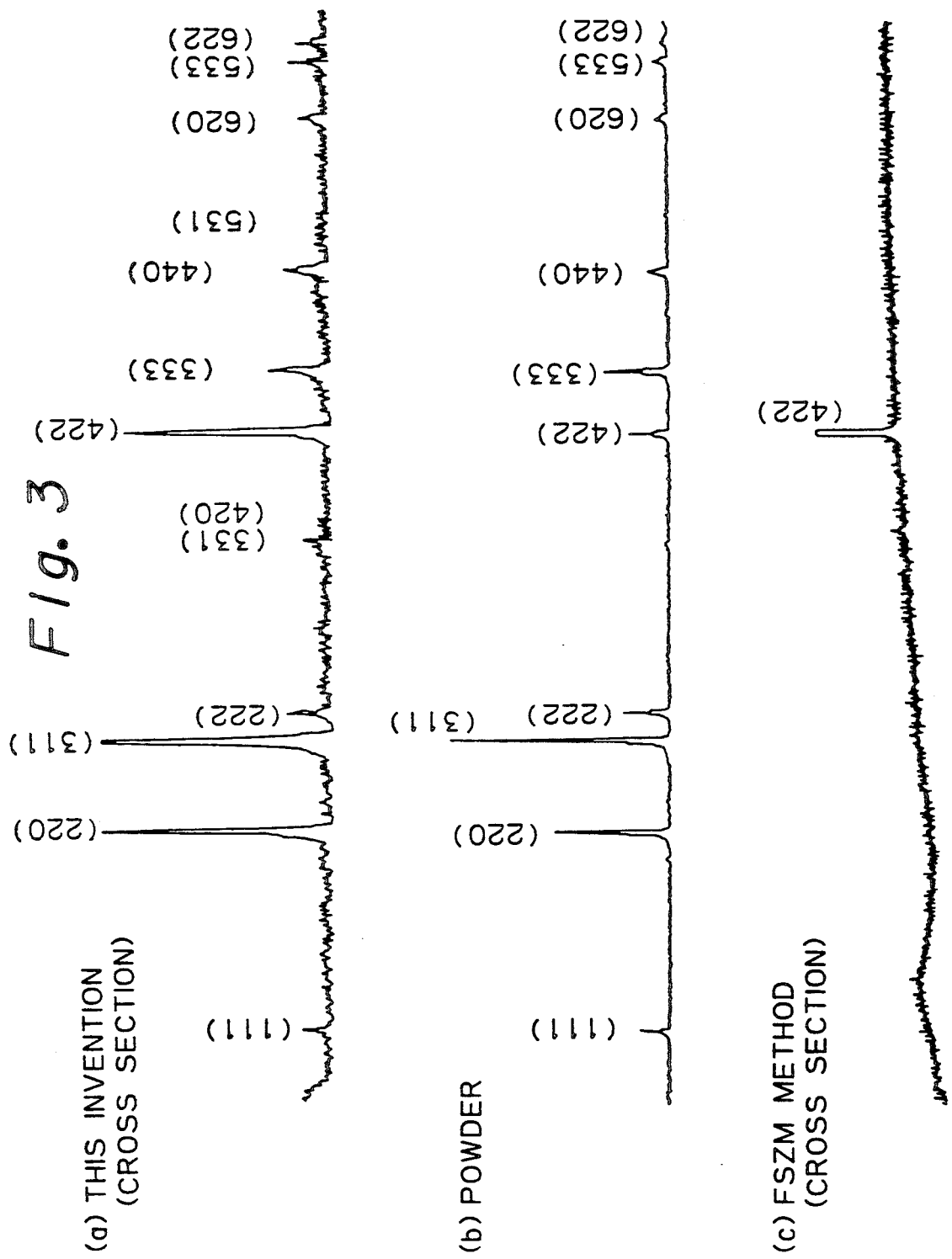
FIGS. 3(a) and 3(b) are X-ray diffraction patterns of a rare earth-iron magnetostrictive material manufactured by the method of the present invention in cross section and in powder form, respectively.
FIG. 3(c) is an X-ray diffraction pattern in cross section of a commercially available single-crystal product manufactured by the FSZM method.

An X-ray diffraction pattern in cross section, i.e., in a plane perpendicular to the longitudinal axis of the heat-treated sample rod obtained in this example is shown in FIG. 3(a).

For reference, FIG. 3(b) shows an X-ray diffraction pattern of the same rod in powder form which was prepared by pulverizing the sample rod, while FIG. 3(c) shows an X-ray diffraction pattern in cross section of a commercially available magnetostrictive single-crystal rod which was manufactured by the FSZM method and had nearly the same composition as the product of this example.

In the X-ray diffraction pattern of the sample rod of this example shown in FIG. 3(a), which was taken in a plane perpendicular to the longitudinal axis of the rod, the peak intensity from (422) planes was increased compared to the corresponding peak of the powdered sample shown in FIG. 3(b). This indicates that axial <112> grain orientation was increased in the sample rod prepared in this example.

Figure 4:
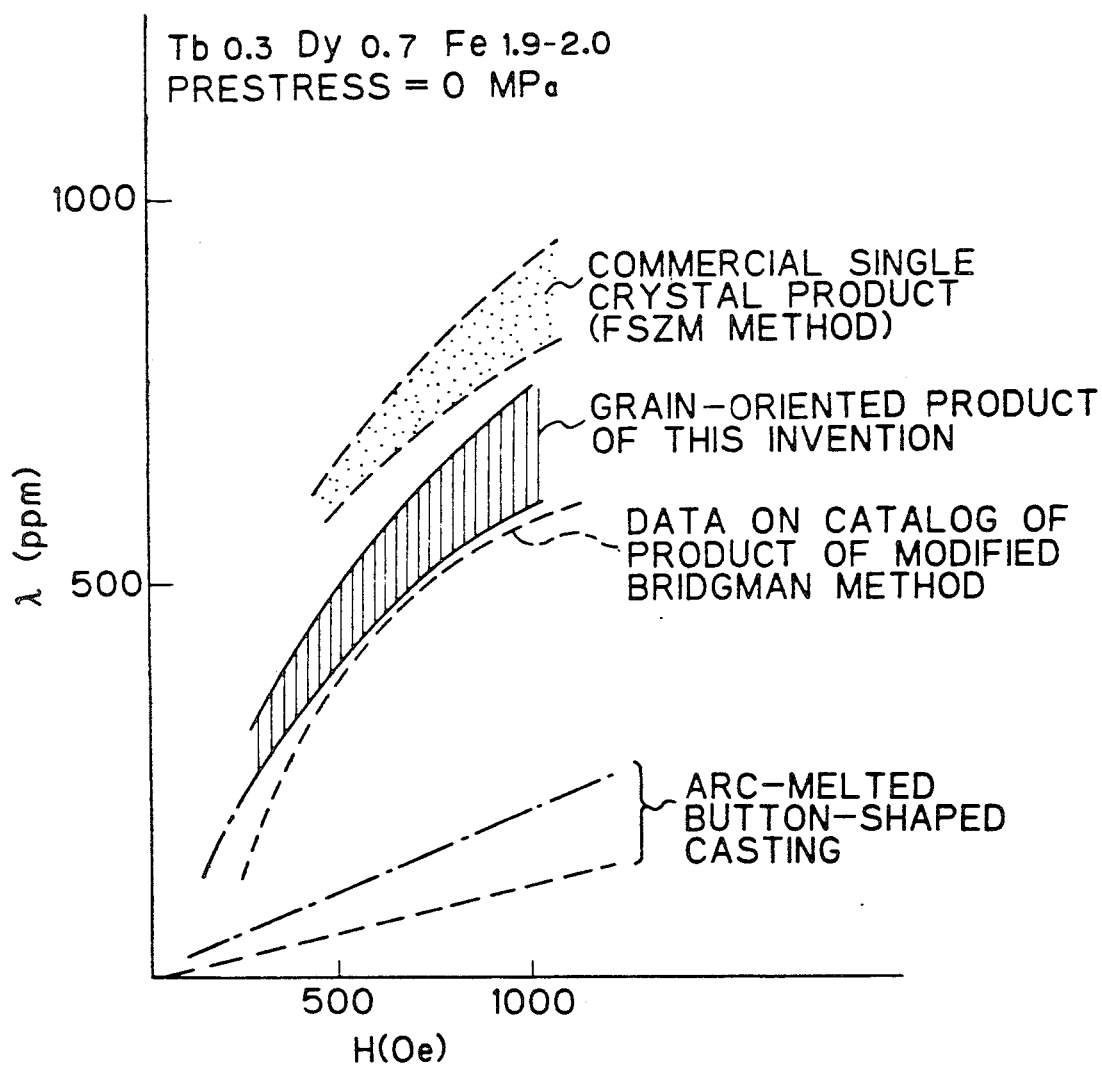
FIG. 4 is a graph showing the magnetostrictive properties of rare earth-iron magnetostrictive materials manufactured by various methods.

The magnetostrictive properties of the sample rod are shown in FIG. 4. For comparison, FIG. 4 also includes the magnetostrictive properties of a commercially available magnetostrictive single-crystal rod manufactured by the FSZM method and an arc-melted casting each having a similar composition. The magnetostrictive data appearing in a catalog of a commercially available magnetostrictive rod manufactured by the modified Bridgman method are also included in FIG. 4.

It an be seen from FIG. 4 that the magnetostrictive material of this example prepared directly from raw materials in accordance with the present invention had excellent magnetostrictive properties at the same level as those of commercially available products manufactured by the FSZM or modified Bridgman method which involves a preliminary alloying step. The magnitude of magnetostriction of the material of this example was much greater than hat of the arc-melted casting prepared from the same raw materials by direct arc melting.

Example 2

A sample cast rod of the magnetostrictive material was prepared in the same manner as described in Example 1 except that the pedestal was withdrawn at a speed of 180 cm/hr and the feed rate of the raw material mixture was correspondingly increased to 189 g/min.

A few hair cracks extending axially along the length of the rod were observed on the circumstantial surface of the rod, but they were not severe and did not adversely affect the magnetostrictive properties of the bulk of the product. The rod had a magnetostriction of $550 \times 10^{-6}$ ppm at 1 kOe in the axial direction.

Example 3

A sample cast rod of the magnetostrictive material was prepared in the same manner as described in Example 1 except that the pedestal was withdrawn at a speed of 10-20 cm/hr and the feed rate of the raw material mixture was correspondingly decreased to 16 g/min.

The appearance of the cast rod was sound with no cracks and it had a magnetostriction of $610 \times 10^{-6}$ ppm at 1 kOe in the axial direction.

Although the present invention has been described with respect to preferred embodiments, it is to be understood that variations and modifications may be employed without departing from the concept of the invention as defined in the following claims.

What is claimed is:

1. A method for manufacturing rare earth-iron magnetostrictive materials comprising continuously feeding rare earth and iron raw materials into a plasma arc melting furnace having a plasma arc torch and a water-cooled bottomless elongated mold located beneath the torch, melting the raw materials together by plasma flames to form a pool of a molten alloy of said rare earth and iron at the top of the mold, removing heat from the melt by water cooling through the mold so as to cause the melt to solidify progressively from the bottom thereof, and continuously pulling down the solidified body in the mold.

2. The method of claim 1 wherein the rare earth of the magnetostrictive material is a combination of Tb with at least one of Dy and Ho.

3. The method of claim 2 wherein the rare earth-iron magnetostrictive material is of the formula $Tb_xDy_{1-x}Fe_{2-w}$ wherein $0.20 \leq x \leq 1.00$ and $0 \leq w \leq 0.20$.

4. The method of claim 3 wherein the rare earth-iron magnetostrictive material is of the formula $Tb_{0.3}Dy_{0.7}Fe_{1.9-1.95}$.

5. The method of claim 1 wherein each of the rare earth raw materials is present in the form of a master alloy of the rare earth with iron.

6. The method of claim 1 wherein argon or helium or a mixture of argon and helium gas is used in the plasma arc torch.

7. The method of claim 1 wherein the solidified body is pulled down at a speed of from about 10 to about 200 cm/hr.

8. The method of claim 1 wherein the magnetostrictive material product is an axially grain-oriented polycrystalline body.

9. The method of claim 1 wherein heat is removed from the melt at a rate high enough to create a G/R ratio which ensures unidirectional solidification of the melt with alignment of grains along the <112> direction.

* * * * *